United States Patent [19]

Sugie et al.

[11] Patent Number: 4,530,070
[45] Date of Patent: Jul. 16, 1985

[54] MAGNETIC BUBBLE MEMORY DEVICE

[75] Inventors: Mamoru Sugie; Takashi Toyooka, both of Sayama; Hirokazu Aoki, Hachioji, all of Japan

[73] Assignee: Hitachi, Ltd., Tokyo, Japan

[21] Appl. No.: 505,448

[22] Filed: Jun. 17, 1983

[30] Foreign Application Priority Data

Jun. 18, 1982 [JP] Japan .................. 57-103822

[51] Int. Cl.³ ............................. G11C 19/08
[52] U.S. Cl. .................................... 365/15
[58] Field of Search ........................... 365/15, 16

[56] References Cited

U.S. PATENT DOCUMENTS 4,133,043 1/1979 Hiroshima et al. ............. 365/15
4,176,405 11/1979 Yoshioka ......................... 365/15

OTHER PUBLICATIONS

IEEE Journal of Solid-State Circuits-vol. SC-15, No. 1; Feb. 1980; pp. 25-32.

Primary Examiner—James W. Moffitt
Attorney, Agent, or Firm—Antonelli, Terry & Wands

[57] ABSTRACT

A magnetic bubble memory device including a magnetic bubble chip of major-minor structure is disclosed in which an integer m prime to the number n of bits of a minor loop is selected from integers i satisfying an equation $i=(2^a\pm 1)\cdot 2^\beta + 1$ or $i=(2^a\pm 1)\cdot 2^\beta$, and logical addresses on the minor loop are assigned in such a manner that adjacent logical addresses are spaced apart from each other by m bits.

10 Claims, 5 Drawing Figures

MAGNETIC BUBBLE MEMORY DEVICE

BACKGROUND OF THE INVENTION

The present invention relates to a magnetic bubble memory device using a magnetic bubble chip with major-minor structure, and more particularly to a method of allocating logical addresses in which the amount of hardware and software necessary to control addressing can be reduced.

In a magnetic bubble memory device using a magnetic bubble chip with major-minor structure, that is, a magnetic bubble chip provided with a plurality of minor loops for storing information and a major loop for reading and writing (or a major line only for reading and another major line only for writing), an address is determined by a bit position on each of the minor loops. In such a magnetic bubble memory device, logical addresses on each minor loop are usually allocated at intervals of a predetermined number of bits, in order to shorten an access time necessary to read out or to write in consecutive addresses.

An example of such address assignment will be explained below.

In case of data retrievel, bubbles to be read are replicated to the read line by a replicator which connects the minor loops to the read major line, in parallel from the major lines. And then, those replicated bubbles are propagated to a bubble detector on the read major line. Bubbles next to be read cannot be replicated to the read major line while the replicated bubbles corresponding to a current address are being propagated on the replicator portion of the read major line. During the bubble propagation on the read major line, all the bubbles in each minor loop are simultaneously propagated along that minor loop. Accordingly, logical address are assigned at interval of m bits so that the bubbles at the next logical addres can reach the replicator portion in the minor loop, when the last bubble of the replicated bubble stream corresponding to the current logical address has passed through the replicator portion in the read major line. In order to make possible such allocation of logical addresses, it is required that the number m of bits indicating a distance between adjacent logical addresses is prime to the number n of bits of each minor loop.

On the other hand, the operation of magnetic bubbles is controlled on the basis of a physical bit position (that is, a physical address) on each minor loop. Accordingly, when logical addresses are assigned at intervals of m bits, it is necessary to translate (or convert) a logical address into a physical address. The logical to physical address conversion can be performed by the following two methods. In the first method, a logical address at the replicator or swap gates is calculated each time magnetic bubbles are propagated by one bit. In the case of the read operation, for example, the replicator is fired just when it is detected that the current physical address is equal to the one corresponding to the logical address of the target page.

In the second method, the number of bits to be propagated before driving the replicator or the swap gate is calculated from a physical address of stop position and the physical address corresponding to the logical address of the target page. In the case of the read operation, the replicator is fired just when the propagation is completed for the calculated number of bits. The physical address of stop position is also calculated from the physical address corresponding to the logical address of the last page when the operation is completed.

The first method is advantageous in that a logical address can be calculated through the addition indicated by the following equation (1), but has a drawback that such addition has to be performed each time magnetic bubbles are propagated by one bit.

$$l_{i+1} = l_i \oplus_{modulo\ n} k \qquad (1)$$

where k indicates a constant which is determined on the basis of the numbers n and m, $l_i$ the logical address magnetic bubbles which are placed at the replicator before magnetic bubbles are propagated by one bit, and $l_{i+1}$ the logical address of magnetic bubbles which are placed at the replicator after magnetic bubbles have been propagated by one bit. Further, the logical address is obtained by the following formula:

$$l = 4 \times a + b$$

On the other hand, the second method is advantageous in that the logical to physical address conversion is made only at the beginning and end of an operation performed for a magnetic bubble chip, but has a drawback that multiplication and division are required in the calculation of address conversion.

In view of the above-mentioned, measures for performing the calculation of address conversion by an arithmetic logic unit (hereinafter referred to as an "ALU") to simplify a microprogram for executing the calculation, is described in an article entitled "The Development of a Bubble Memory Controller for Low-Cost File Use"(IEEE Journal of Solid-State Circuits, Vol. SC-15, No. 1, February 1980, Page 25).

In this article, the number m of bits indicating a distance between adjacent logical addresses and the number n bits which each minor loop includes, are determined so as to satisfy the following equation:

$$n = 4m - 1 \qquad (2)$$

In this case, a physical address p corresponding to a logical address l can be calculated from the following equation (3) by using a quotient a and a remainder (namely, surplus) b which are obtained when l is divided by 4.

$$p = m \times b + a \qquad (3)$$

The division of a numeral value by $2^x$ (where x is a positive integer) can be performed by an ALU having a shift-right function (namely, a function of shifting each bit to the right), and therefore the use of such division in address conversion makes simple not only the circuit structure of ALU but also a microprogram for executing address conversion.

In the conventional example mentioned above, the calculation of address conversion can be readily performed on the basis of the equation (2), though the above division is not used. However, some useless addresses which are not accessed, are produced on each of minor loops which are provided on a magnetic bubble chip, and thus that area of the magnetic bubble chip which is occupied by the minor loops, is wastefully increased.

SUMMARY OF THE INVENTION

An object of the present invention is to provide a magnetic bubble memory device in which the logic of an ALU for converting a logical address into a physical address can be simplified.

Another object of the present invention is to provide a magnetic bubble memory device in which each of minor loops is prevented from including some useless addresses unsuitable for storing information, and thus the area of a magnetic bubble chip can be made small.

In order to attain these objects, in a magnetic bubble memory device according to the present invention, an integer m which is prime to the number n of bits of each minor loop, is selected from integers i given by one of the following equations:

$$i = (2^\alpha \pm 1) \cdot 2^\beta + 1 \quad (5)$$

$$i = (2^\alpha \pm 1) \cdot 2^\beta \quad (6)$$

and logical addresses on each minor loop are assigned in such a manner that adjacent logical addresses, that is, y-th and (y+1)th logical addresses (where y is an arbitrary number) are spaced apart from each other by m bits where $\alpha$ and $\beta$ are arbitary positive integers.

In the case where the integer m is selected on the basis of the equation (5), the number n of bits of each minor loop can be made equal to a value given by the following equation:

$$n = 2^\gamma \quad (7)$$

where $\gamma$ is an arbitrary positive integer.

When each minor loop includes $2^\gamma$ bits, all addresses on the minor loop are accessible and therefore a wasteful increase in the area of magnetic bubble chip can be avoided.

On the other hand, a desired logical address l can be converted into a physical address p by the following equation:

$$p = SUR^* \{(l \times m) \div n\} \quad (8)$$

* SUR designates a function which gives the surplus

By using the equations (5) and (7) in the equation (8), the physical address p is expressed as follows:

$$p = SUR[l \cdot \{(2^\alpha \pm 1) \cdot 2^\beta + 1\} \div 2^\gamma] \quad (9)$$

$$= [SUR\{l \cdot (2^\alpha \pm 1) \div 2^{(\gamma-\beta)}\} \times 2^\beta \oplus \text{modulo } nl$$

The term $l(2^\alpha \pm 1)$ can be calculated by a shift-left function (a function of shifting each bit to the left) of an ALU and an adding or subtracting operation. Further, a dividing operation using $2^{(\gamma-\beta)}$ as a divisor can be performed by the shift-right function of the ALU, and a multiplying operation using $2^\beta$ as a multiplier can be performed by the shift-left function. Accordingly, the physical address p can be readily calculated from the equation (9) by using an ALU having shift-left and shift-right functions and by using a simple microprogram. Further, it is not required to calculate the product ($l \times m$) itself which has a large number of digits, and therefore the number of bits included in a register can be reduced.

Further, in the case where the integer m is selected on the basis of the equation (6), the number n of bits of each minor loop can be made equal to a value given by the following equation:

$$n = 2^\gamma + 1 \quad (10)$$

When each minor loop includes ($2^\gamma + 1$) bits, only one address is inaccessible. Accordingly, a wasteful increase in the area of magnetic bubble chip can be substantially avoided, as in the case where each minor loop includes $2^\gamma$ bits. In the case where the integer m is determined on the basis of the equation (6), a physical address p corresponding to a logical address l can be calculated from the following equation (11) in which the quotient q of ($l \times m$) divided by n is estimated by the quotient q' of $l(2^\alpha \pm 1)$ divided by $2^{(\gamma-\beta)}$.

$$p = l(2^\alpha \pm 1) \cdot 2^\beta - (2^\gamma + 1) \cdot q' \quad (11)$$

The right-hand side of the equation (11) can be readily calculated by an ALU having shift-right and shift-left functions. Accordingly, a microprogram for executing address conversion becomes small in the number of steps, and it is possible to reduce the number of bits of a register used.

DESCRIPTION OF THE PREFERRED EMBODIMENTS

Prior to the explanation of embodiments of the present invention, an example of conventional magnetic bubble memory devices will be explained, with reference to FIG. 1. The conventional device is based upon techniques described in the previously-referred article (IEEE Journal of Solid-State Curcuits, Vol. SC-15, No. 1, February 1980, Page 25).

Figure 1:
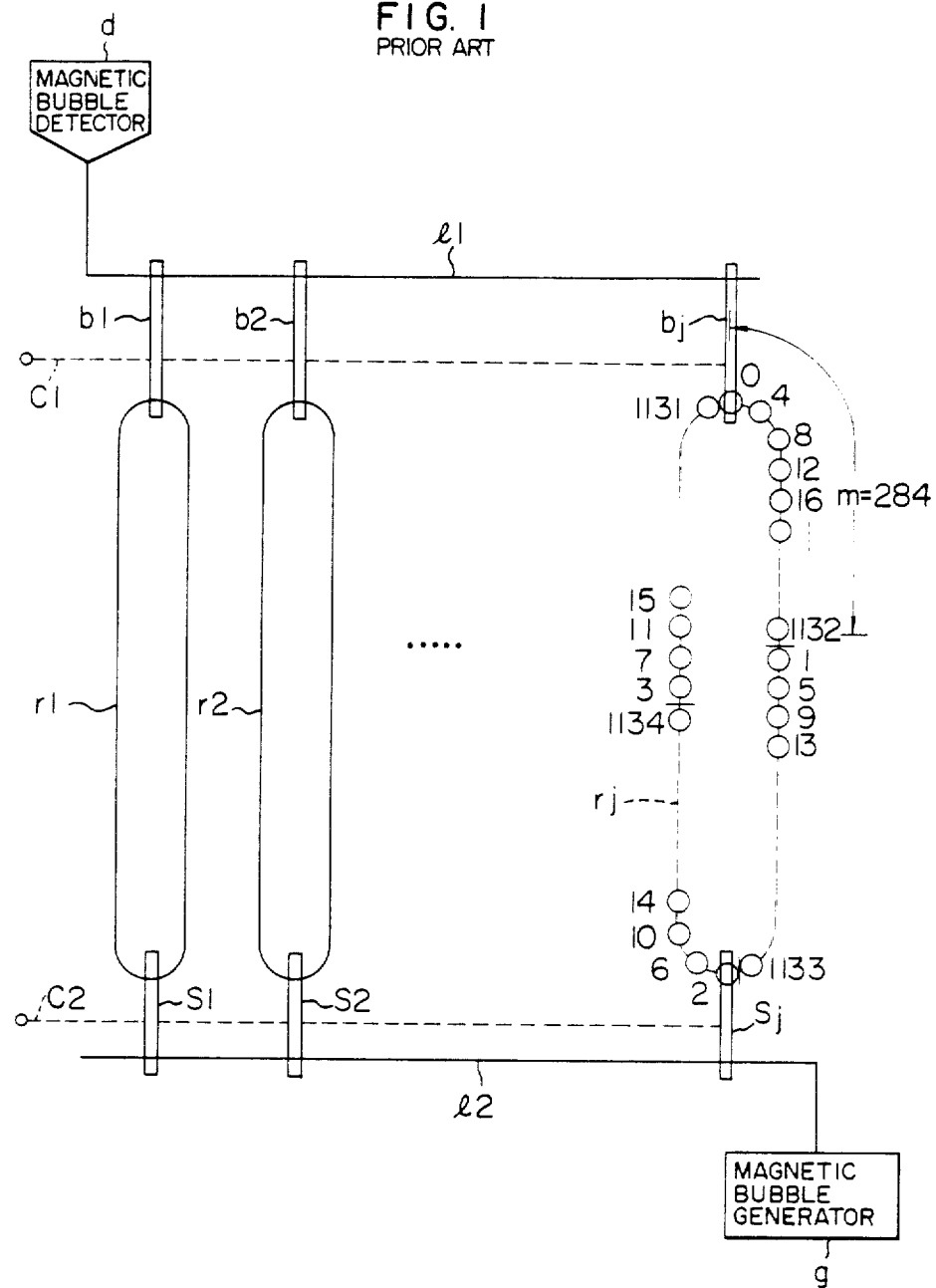
FIG. 1 is a schematic view showing a conventional magnetic bubble chip.

Referring to FIG. 1, magnetic bubbles generated by a magnetic bubble generator q are sent to a write major line 12, and then transferred to minor loops rl to rj in parallel, through swap gates S1 to Sj which are controlled by a control line C2. J pieces of information which are held by the minor loops at a desired address, are replicated onto a read major line 11 in parallel, through a replicator made up of replicate gates b1 to bj which are controlled by a control line C1. The j pieces of information are then propagated in series on the read major line 11, to be successively read out by a magnetic bubble detector d. Simultaneously with the above replication of the j pieces, magnetic bubbles on each minor loop circulate through each minor loop. Accordingly, logical addresses on each minor loop are assigned in such a manner that adjacent logical addresses (namely, y-th and (y+1)th logical addresses) are space apart from each other by m bits, in order that j pieces of information stored in the minor loops at the (y+1)th logical address reach the replicators b1 to bj when the j pieces of information stored in the minor loops at the y-th logical address have passed through the replicate gates b1 to bj. The number m of bits indicating the distance between adjacent logical addresses is actually made larger than the number j of minor loops. On the other hand, the number n of bits of each minor loop is set so as to satisfy the equation (2). In this case, the calculation for converting a logical address into a physical address can be readily performed. In the example shown in FIG. 1, the number m of bits indicating a distance between adjacent logical addresses is equal to 284, and the number n of bits of each minor loop is equal to 1135. In FIG. 1, numerals written around the minor loop rj designate logical addresses on each minor loop. Of 1135 addresses on each minor loop, only $2^8$ addresses (where q is a positive integer) are used to access information. On the other hand, the amount of data at one address, that is, the number of minor loops for storing information is equal to the r-th power of 2 (where r is a positive integer). However, a magnetic bubble chip is usually provided with additional minor loops which are used as spares for defective minor loops, and therefore the number j of minor loops provided on the chip is larger than the r-th power of 2.

Further, the number m of bits indicating a distance between adjacent logical addresses is made larger than the number j of minor loops, and therefore is expressed by the following equation:

$$m = 2^r + C \tag{13}$$

where C is a positive integer.

By using the above equation (13) in the equation (2), the number n of bits of each minor loop is given by the following equation:

$$n = 4 \cdot 2^r + 4C - 1 \tag{14}$$

Of n bits given by the above equation, only $4 \cdot 2^r$ bits are accessed. Accordingly, each minor loop includes excessive addresses corresponding to $(4C-1)$ bits. About 10% of the area of magnetic bubble chip is occupied by such excessive addresses. In the example shown in FIG. 1, the logical addresses 0 to 1023 are actually accessed, and the logical address 1024 and the following logical addresses are excessive ones.

Figure 2:
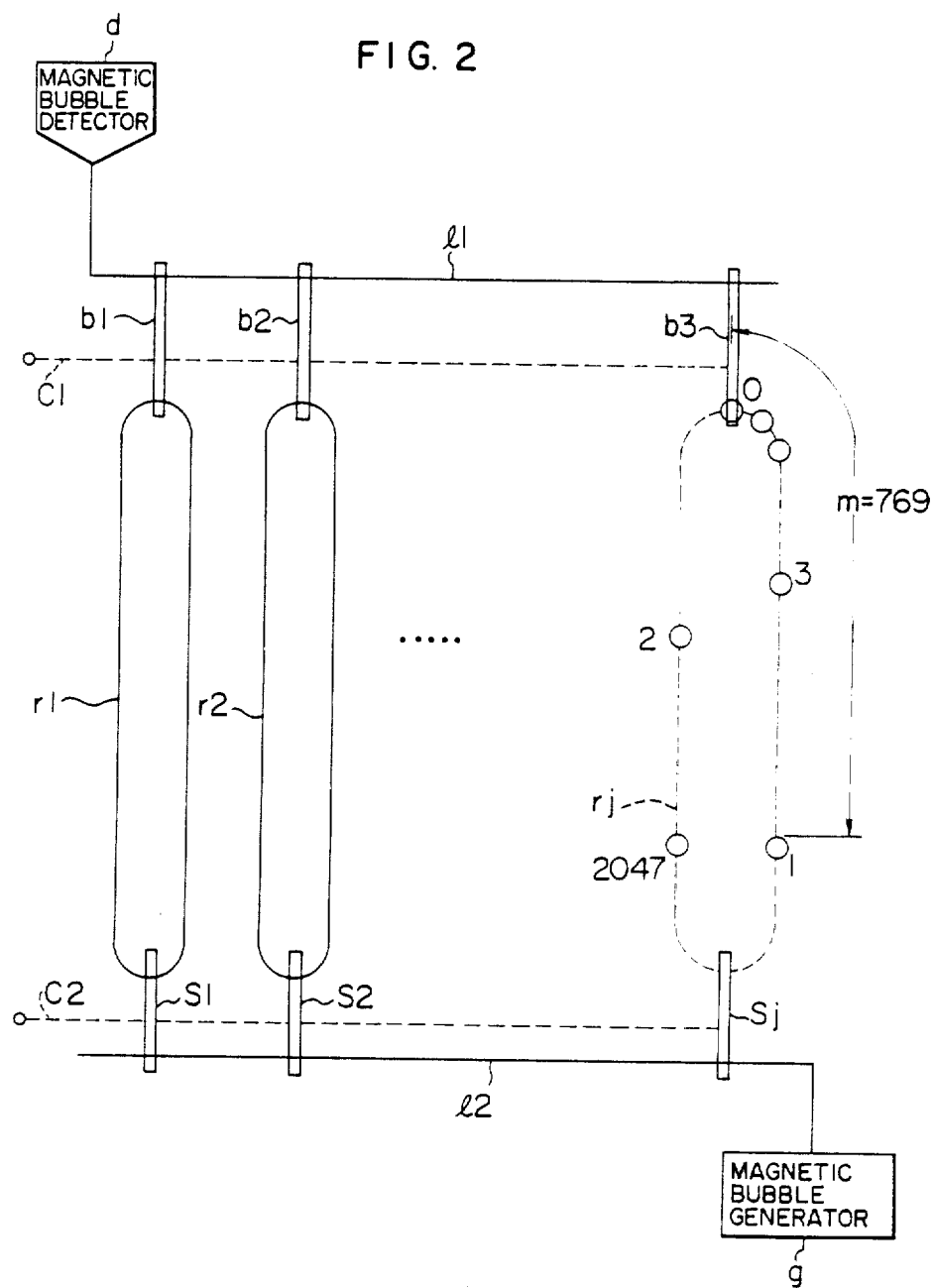
FIG. 2 is a schematic view showing the structure of a magnetic bubble chip included in a first embodiment of a magnetic bubble memory device according to the present invention.

FIG. 2 shows the structure of a magnetic bubble chip included in a first embodiment of a magnetic bubble memory device according to the present invention. In the present embodiment, logical addresses on each of minor loop r1 to rj are assigned in such a manner that the number m of bits indicating a distance between adjacent logical addresses is determined on the basis of the equation (5) and takes the following value:

$$m = (2+1) \cdot 2^8 + 1 = 769 \tag{15}$$

On the other hand, the number n of bits of each minor loop is set as follows:

$$n = 2^{11} = 2048 \tag{16}$$

Other reference symbols in FIG. 2 designate the same elements or parts as in FIG. 1.

In the present embodiment, all addresses of each minor loop can be used to store information. Accordingly, each minor loop does not include excessive addresses such as produced in the conventional example of FIG. 1, and therefore the size of magnetic bubble chip can be made small.

Figure 3:
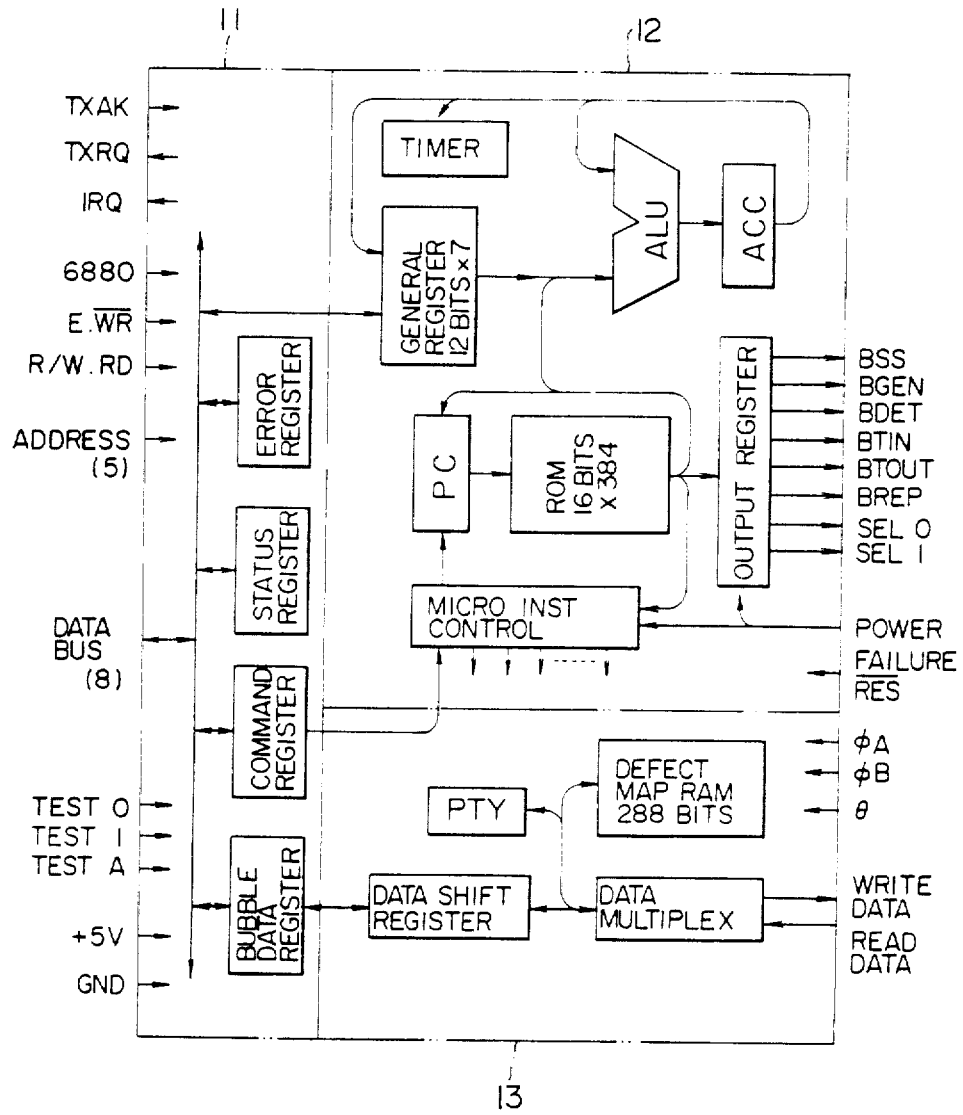
FIG. 3 is a block diagram showing an example of a bubble memory controller used in the first embodiment of a magnetic bubble memory device according to the present invention.

FIG. 3 shows, in block, an example of a magnetic bubble memory controller used in the present embodiment. In FIG. 3, reference numeral 11 designates an interface block connected to a host computer, 12 a control block, and 13 an input/output block. The controller shown in FIG. 3 is a general controller provided with an ALU, and is described in the previously-referred article (IEEE Journal of Solid-State Circuits, Vol. SC-15, No. 1, February 1980, page 25). Therefore, detailed explanation of the controller is omitted.

A physical address p corresponding to a desired logical address l is calculated by the above controller on the basis of the following equation:

$$p = \{SUR(3 \cdot l \div 2^3)\} \times 2^8 \oplus modulo \ 2048 \ l \tag{17}$$

Figure 4:
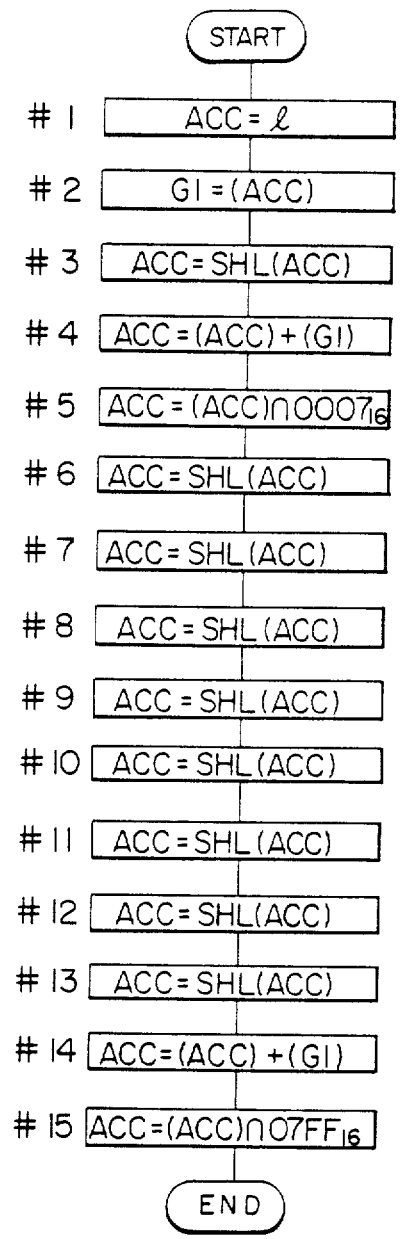
FIG. 4 is a flow chart showing a calculation procedure for obtaining a physical address corresponding to a logical address, at the magnetic bubble chip shown in FIG. 2.

A program flowchart for performing the above calculation is shown in FIG. 4. Referring to FIG. 4, the product $3 \cdot l$ is calculated in steps 1 to 4, the surplus of the division $3 \cdot l \div 2^3$ is obtained in step 5, the surplus thus obtained is multiplied by $2^8$ through eight shift-left operations in steps 6 to 13, and the product of the above surplus and $2^8$ is added to l (modulo 2048) in steps 14 and 15.

Now, explanation will be made on an actual procedure for reading out data, in the first embodiment which has been explained with reference to FIGS. 2 to 4.

The case where three pages beginning at a third logical address (namely, logic address 3) are read out, will be explained, by way of example. Now, let us consider the state that a stopped physical address $p_{stop}$ is 5, that is, magnetic bubbles of physical address 5 are brought to and halt in those portions of the replicate gates b1 to bj which are connected with the minor loops r1 to rj. First, the physical address 259 corresponding to the logical address 3 is calculated by the flow chart shown in FIG. 4, and thus it is known that magnetic bubbles are to be propagated by 254 bits which correspond to the difference between the stopped physical address 5 and the physical address 259. Then, a rotating magnetic field is applied to the magnetic bubble chip to propagate magnetic bubbles, and the replicate gates b1 to bj are operated when magnetic bubbles have been propagated by 254 bits. Thereafter, the replicate gates are again operated when magnetic bubbles are propagated by 769 bits, and such an operation is twice performed. Finally, magnetic bubbles are propagated by T bits which correspond to the distance between the detector d and last minor loop rj. Thus, the operation for reading out information stored in the three pages is completed. Accordingly, the application of the rotating magnetic field is stopped when magnetic bubbles have been propagated by T bits, and a physical address $p_{stop}$ at the time the application of the rotating magnetic field is stopped, is calculated to be used in the next operation. The calculation of the above physical address $p_{stop}$ is performed in the following manner. That is, a physical address $p_{last}$ corresponding to the logical address 5 (namely, the fifth logical address) is calculated by the flow-chart shown in FIG. 4, to be used in calculating the physical address $p_{stop}$ on the basis of the following equation:

$$p_{stop} = p_{last} \oplus modulo 2048 T \quad (18)$$

The physical address $p_{stop}$ thus obtained is stored in one of registers, to be used in the next reading operation or a writing operation.

In the above-mentioned, the calculation of physical address in reading out information from the first embodiment of a magnetic bubble device according to the present invention has been explained, together with the operation of the embodiment. Further, when information is written in the first embodiment, a physical address p corresponding to a desired logical address l is calculated by using the flow chart shown in FIG. 4, as in the case where information is read out.

Next, explanation will be explained on a second embodiment of a magnetic bubble memory device according to the present invention. In a magnetic bubble chip included in the second embodiment, the number m of bits indicating a distance between adjacent logical addresses and the number n of bits of each minor loop are determined on the basis of the equations (6) and (10), and given as follows:

$$m = (2^2 + 1) \cdot 2^7 = 640 \quad (19)$$

$$n = 2^{11} + 1 = 2049 \quad (20)$$

The structure of the magnetic bubble chip is similar to that shown in FIG. 2, except for the above numbers of bits, and therefore illustration of the magnetic bubble chip is omitted. Further, a magnetic bubble memory controller used in the second embodiment is similar to that shown in FIG. 3.

In the present embodiment, a desired logical address l is converted into a physical address p on the basis of the following equation:

$$p = l \cdot (2^2 + 1) \cdot 2^7 - (2^n + 1) \cdot q' \quad (21)$$

Figure 5:
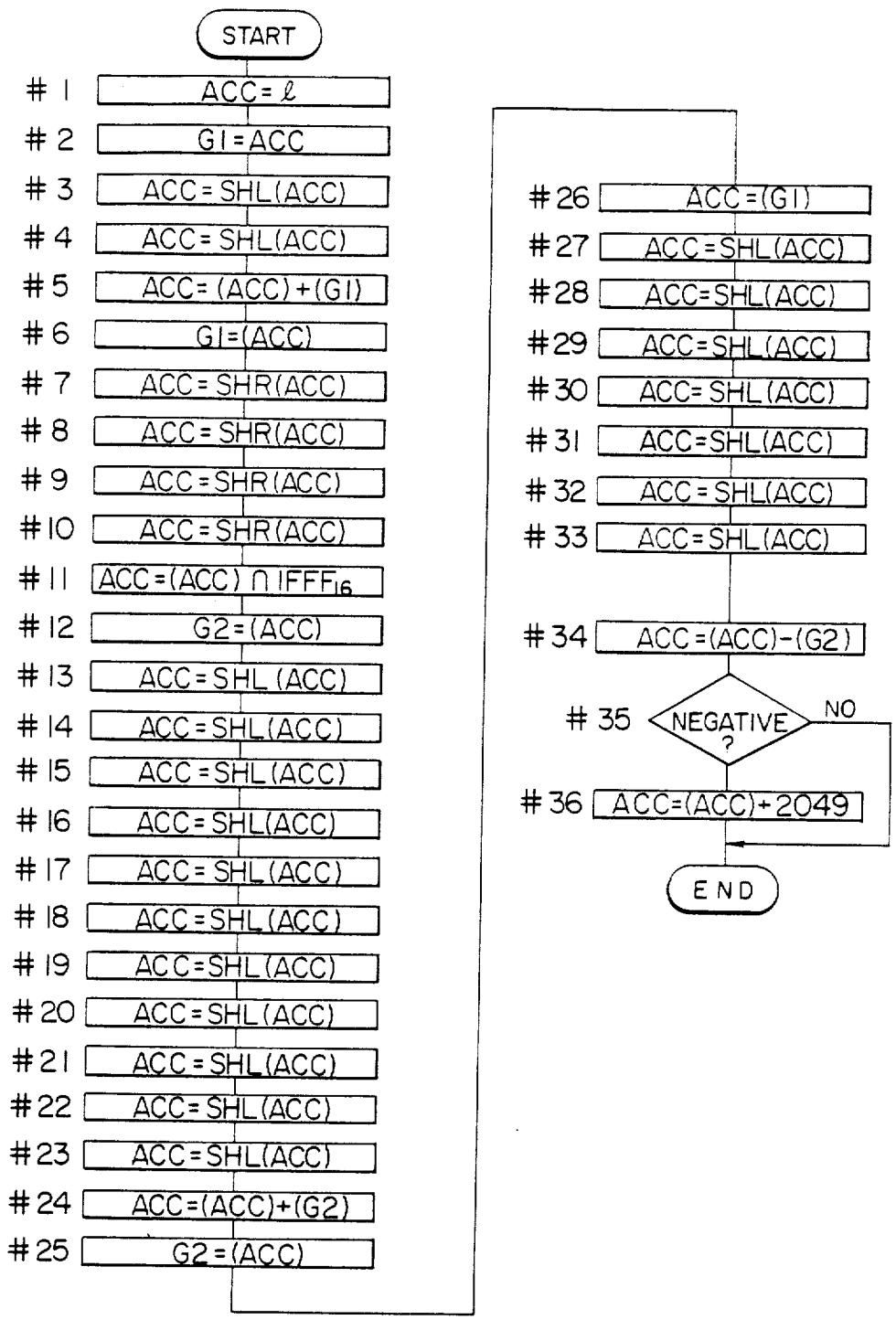
FIG. 5 is a flow chart showing a calculation procedure for obtaining a physical address corresponding to a logical address, at a magnetic bubble chip which is included in a second embodiment of a magnetic bubble memory device according to the present invention.

FIG. 5 is a flow chart showing a procedure in calculating the right-hand side of the equation (21). Referring to FIG. 5, in steps 1 to 6, the value of $l \cdot (2^2 + 1)$ is calculated, and stored in a register G1. Next, in steps 7 to 12, the quotient q' of $l(2^2 + 1)$ divided by $2^4$ is calculated, and stored in a register G2. In steps 13 to 25, the value of $(2^{11} + 1) \cdot q'$ is calculated, and stored in the register G2. Next, the value of $l(2^2 + 1) \cdot 2^7$ is calculated in steps 26 to 33. Then, the value of the physical value p is calculated by subtraction shown in step 34. Strictly speaking, the value of the physical address p should be calculated from an equation which is obtained by substituting the quotient q of $l(2^\alpha + 1) \cdot 2^\beta$ divided by $(2^\gamma + 1)$ for the quotient q' of $l(2^\alpha + 1)$ divided by $2^{(\gamma - \beta)}$, in the equation (11). However, in the calculation process shown in FIG. 5, the quotient q' of $l(2^2 + 1)$ divided by $2^{(\gamma - \beta)}$ is used in place of the quotient q of $l(2^2 + 1) \cdot 2^\beta$ divided by $(2^\gamma + 1)$, to facilitate calculation. Accordingly, in some cases, the value of p obtained in step 34 becomes negative. Therefore, it is judged in step 35 whether the value of p is positive or negative. When the value of p is negative, it is changed to a correct value in step 36.

As mentioned above, in the present embodiment, the division using $2^{(\gamma - \beta)}$ as a divisor is performed in place of the division using $(2^\gamma + 1)$ as a divisor, and therefore a calculation process for converting a logical address into a physical address can be simplified by using an ALU having shift-right and shift-left functions. Accordingly, the amount of hardware required to make up the ALU and the capacity of a read only memory for storing therein a microprogram for address conversion can be reduced. Further, in the magnetic bubble chip included in the present embodiment, only one of the addresses on each minor loop cannot be used for holding information, and therefore the number of useless addresses is far smaller, as compared with the conventional example shown in FIG. 1. Thus, the magnetic bubble chip can be made small in size.

In the foregoing description, the first and second embodiments which include a magnetic bubble chip provided with a read major line and a write major line, have been explained. It is to be noted that present invention is also applicable to a magnetic bubble memory device which includes a magnetic bubble chip provided with a major loop for both reading and writing. Further, it is needless to say that the present invention is applicable to a magnetic bubble memory device including a magnetic bubble chip of Even-Odd type in which even-numbered minor loops and odd-numbered minor loops are connected to different read major lines.

We claim:

1. A magnetic bubble memory device including a plurality of minor loops each having a capacity of n bits and storing information which is indicated by a row of magnetic bubbles circulating through each minor loop, reading transfer means and writing transfer means coupled to said minor loops for transferring in series a plurality of pieces of information which are read out form or to be written in said minor loops for transferring in series a plurality of pieces of information which are read out from or to be written in said minor loops in parallel, and a magnetic bubble detector coupled to said reading transfer means, bubble generator means coupled to said writing transfer means wherein an integer m prime to the bit capacity n of each minor loop is selected from integers i satisfying an equation $i = (2^\alpha \pm 1) \cdot 2^\beta + 1$ where $\alpha$ and $\beta$ are arbitrary positive integers, and logical addresses on each minor loop are assigned in such a manner that adjacent logical addresses are spaced apart from each other by m bits.

2. A magnetic bubble memory device according to claim 1, comprising control means for calculating a physical address p corresponding to a desired logical address l and controlling transfer of pieces of information between said reading transfer means and said minor loops after a magnetic bubble chip provided with said minor loops has been operated in accordance with a difference between said calculated physical address and a physical address $p_{stop}$ which includes physical address of connecting position between said reading transfer means and said minor loops before said magnetic bubble chip is operated.

3. A magnetic bubble memory device according to claim 2, wherein said control means calculates a physical address corresponding to the last logical address of a series of logical addresses which has been read out, to obtain said physical address $p_{stop}$ by adding a constant to said physical address corresponding to said last logical address.

4. A magnetic bubble memory device according to claim 1, wherein said bit capacity n of each minor loop satisfies an equation $n = 2^\gamma$.

5. A magnetic bubble memory device according to claim 4, comprising a control circuit for calculating a physical address p corresponding to a desired logical address l on the basis of an equation $p = [SUR\{1 \times (2^\alpha \pm 1) \div 2^{(\gamma-\beta)}\}] \times 2^\beta [\oplus_{modulo\ n} 1] \oplus_{modulo\ n} 1$ where $\gamma$ is an arbitrary positive integer.

6. A magnetic bubble memory device including a plurality of minor loops each having a capacity of n bits and storing information which is indicated by a row of magnetic bubbles circulating through each minor loop, reading transfer means and writing transfer means coupled to said minor loops for transferring in series a plurality of pieces of information which are read out from or to be written in said minor loops in parallel, sand a magnetic bubble detector coupled to said reading transfer means, bubble generator means coupled to said writing transfer means wherein an integer m prime to the bit capacity n of each minor loop is selected from integers i satisfying an equation $i = (2^\alpha \pm 1) \cdot 2^\beta$ where $\alpha$ and $\beta$ are aribtrary positive integers, and logical addresses on each minor loop are assigned in such a manner that adjacent logical addresses are spaced from each other by m bits.

7. A magnetic bubble memory device according to claim 6, comprising control means for calculating a physical address p corresponding to a desired logical address l and controlling transfer of pieces of information between said reading transfer means and said minor loops after a magnetic bubble chip provided with said minor loops has been operated in accordance with a difference between said calculated physical address and a physical address $p_{stop}$ which indicates physical address of connecting position between said reading transfer means and said minor loops before said magnetic bubble chip is operated.

8. A magnetic bubble memory device according to claim 7, wherein said control means calculates a physical address corresponding to the last logical address of a series of logical addresses which has been read out, to obtain said physical address $p_{stop}$ by adding a constant to said physical address corresponding to said last logical address.

9. A magnetic bubble memory device according to claim 6, wherein said bit capacity n of each minor loop satisfies an equation $n = 2^\gamma + 1$.

10. A magnetic bubble memory device according to claim 9, comprising a control circuit for calculating a physical address p corresponding to a desired logical address l on the basis of an equation $p = l \cdot (2^\alpha \pm 1) \cdot 2^\beta - (2^\gamma + 1) \cdot q'$, where $\gamma$ is an arbitrary positive integer and q' is the quotient of $l(2^\alpha \pm 1)$ divided by $2^{(\gamma-\beta)}$.

* * * * *